United States Patent
Takahashi

(10) Patent No.: US 7,688,636 B2
(45) Date of Patent: Mar. 30, 2010

(54) SEMICONDUCTOR DEVICE

(75) Inventor: Hiroyuki Takahashi, Kawasaki (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/942,742

(22) Filed: Nov. 20, 2007

(65) Prior Publication Data

US 2008/0144360 A1 Jun. 19, 2008

(30) Foreign Application Priority Data

Dec. 19, 2006 (JP) .............................. 2006-341626

(51) Int. Cl.
*G11C 16/06* (2006.01)
(52) U.S. Cl. .................. 365/185.21; 365/196; 365/207; 365/189.05; 365/230.06
(58) Field of Classification Search ............ 365/185.21, 365/196, 207, 189.05, 230.06
See application file for complete search history.

(56) References Cited

U.S. PATENT DOCUMENTS 5,020,028 A * 5/1991 Wanlass ..................... 365/154

| | | | |
|---|---|---|---|
| 2006/0227595 A1* | 10/2006 | Chuang et al. | 365/154 |
| 2007/0041239 A1* | 2/2007 | Takeda | 365/154 |
| 2007/0133327 A1* | 6/2007 | Huang | 365/207 |
| 2008/0025109 A1* | 1/2008 | Lee | 365/189.05 |

FOREIGN PATENT DOCUMENTS

JP 10-41409 2/1998

OTHER PUBLICATIONS

"Approaches to Control a SRAM Variation for LSI are Proposed in a Stream," Nikkei Electronics, 2006.7, vol. 17, pp. 55-62 (Jun. 13-17, 2006).

* cited by examiner

*Primary Examiner*—Thong Q Le
(74) *Attorney, Agent, or Firm*—Young & Thompson

(57) ABSTRACT

A semiconductor device comprises a first memory cell comprising more than seven transistors and storing data in a latch circuit; and a second memory cell storing data in a capacitor; a sense amplifier having about the same circuit configuration of the first memory cell and detecting data stored in the second memory cell.

22 Claims, 9 Drawing Sheets

PRIOR ART

SEMICONDUCTOR DEVICE

BACKGROUND OF THE INVENTION

1. Field of the Invention

This invention relates to a semiconductor device including both a static random access memory (SRAM) and a dynamic random access memory (DRAM).

2. Description of Related Art

A semiconductor device comprising a semiconductor substrate both a SRAM and a DRAM are formed on is well known (for example, see Japanese Unexamined Patent Publication No. 10-041409). High-speed memory access can be obtained with the SRAM and large capacity with small area can be provided with the DRAM. FIG. 8 shows a general circuit configuration of a SRAM cell, which is formed to like this semiconductor device.

As shown in FIG. 8, the SRAM cell generally consists of six transistors. This SRAM cell has a latch circuit 89. The latch circuit 89 includes NMOS transistors 81, 82 and PMOS transistors 83, 84. Further, the SRAM cell includes transfer transistors 85, 86. The transfer transistors 85, 86 transfer data stored in the latch circuit 89 to bit lines BL and /BL.

In the SRAM cell formed as described above, threshold variation of transistors 81-86 becomes a great factor of malfunction according to progress in manufacturing miniaturization. Furthermore, because of lower control voltage for electric power saving, stability of operation gets worse. As a result, there is a problem that yield of manufacturing process becomes lower when the SRAM cell is formed to the semiconductor device. To improve the yield of manufacturing process, new approaches has been researched and developed. For one of the new approaches, a new configuration is applied to the SRAM cell as to obtain high stability even in low-voltage condition (for example, that is shown in "Approaches to control a SRAM variation for LSI are proposed in a stream", Nikkei electronics, 2006.7, Vol. 17, p. 55-62).

On the other hand, semiconductor device, which the DRAM is formed on, has a sense amplifier. As shown in FIG. 9, the sense amplifier of the DRAM comprises NMOS transistors 91, 92, PMOS transistors 93, 94, and transfer transistors 95, 96. A bit line BL and a complemental bit line /BL of the DRAM cell are connected to nodes n7, n8 in FIG. 9. A potential difference between the bit lines BL, /BL is amplified by the NMOS transistors 91, 92 and the PMOS transistors 93, 94. The NMOS transistors 91, 92 and the PMOS transistors 93, 94 are electrically connected each other like as the latch circuit 89. Data based on the amplified potential difference is transferred to a data bus Bus and /Bus by the transfer transistors 95, 96.

Comparing FIG. 8 with FIG. 9, it can be seen that the NMOS transistors 91, 92 of the sense amplifier correspond to the transistors 81, 82 of the SRAM cell. The PMOS transistors 93, 94 of the sense amplifier correspond to the transistors 83, 84 of the SRAM cell. The transfer transistors 95, 96 of the sense amplifier correspond to the transistors 85, 86 of the SRAM. A circuit 99 (hereinafter, it is called as a latch circuit 99) amplifying the potential difference between a pair of bit lines BL and /BL corresponds to the latch circuit 89 of the SRAM. This is, the sense amplifier of the DRAM has about the same configuration of the SRAM cell.

As described above, when a circuit configuration of the SRAM cell is changed as to save electric power and rein in the negative effect of manufacturing variation, for the semiconductor device including both the SRAM and the DRAM, a configuration of the SRAM cell does not correspond to the sense amplifier of the DRAM. Hence, a tuning window of the SRAM cell does not correspond to the sense amplifier of the DRAM. The tuning window means manufacturing condition in which minimum manufacturing variation can be obtained. When the semiconductor device is manufactured with the tuning window of the SRAM cell, the sense amplifier of the DRAM tends to have a defect. As described above, for the semiconductor device including both the DRAM and the SRAM, when electric power saving is aimed, mass productivity cannot be obtained.

SUMMARY

According to an aspect of the present invention, there is provided a semiconductor device that includes a semiconductor device comprising; a first memory cell comprising more than seven transistors and storing data in a latch circuit; and a second memory cell storing data in a capacitor; a sense amplifier having about the same circuit configuration of the first memory cell and detecting data stored in the second memory cell.

According to another aspect of the present invention, there is provided a semiconductor device comprising; a first memory cell comprising more than seven transistors and storing data in a latch circuit; and a second memory cell storing data in a capacitor; a sense amplifier having about the same circuit configuration of the first memory cell and detecting data stored in the second memory cell, wherein the first memory cell comprising a plurality of a first and a second conductivity type transistors, and wherein the sense amplifier comprising same number of the first and the second conductivity type transistors as the first memory cell.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Referring to attached figures, preferable embodiments of this invention are described hereinafter.

First Embodiment

Figure 1:
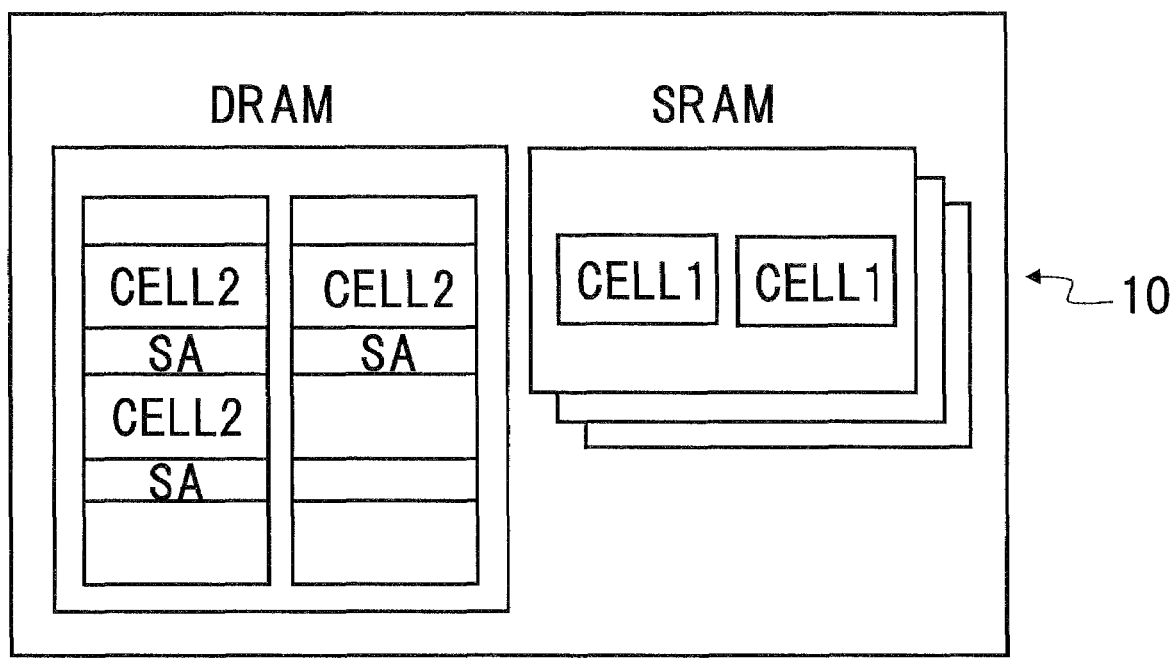
FIG. 1 shows a whole circuit configuration of semiconductor device 10 according to a first embodiment.

FIG. 1 shows a block diagram of a whole configuration of a semiconductor device according to a first embodiment. This semiconductor device 10 includes a SRAM block and a DRAM block. The SRAM block includes a plurality of SRAM cells CELL 1. The SRAM cell CELL 1 includes a latch circuit (not shown) storing data. The DRAM block includes a plurality of DRAM cells CELL 2 and a plurality of sense amplifiers SA. The DRAM cell CELL 2 has capacitors storing data and transistors (not shown). Data stored in the DRAM cell is read out and output by the sense amplifier SA.

Figure 2:
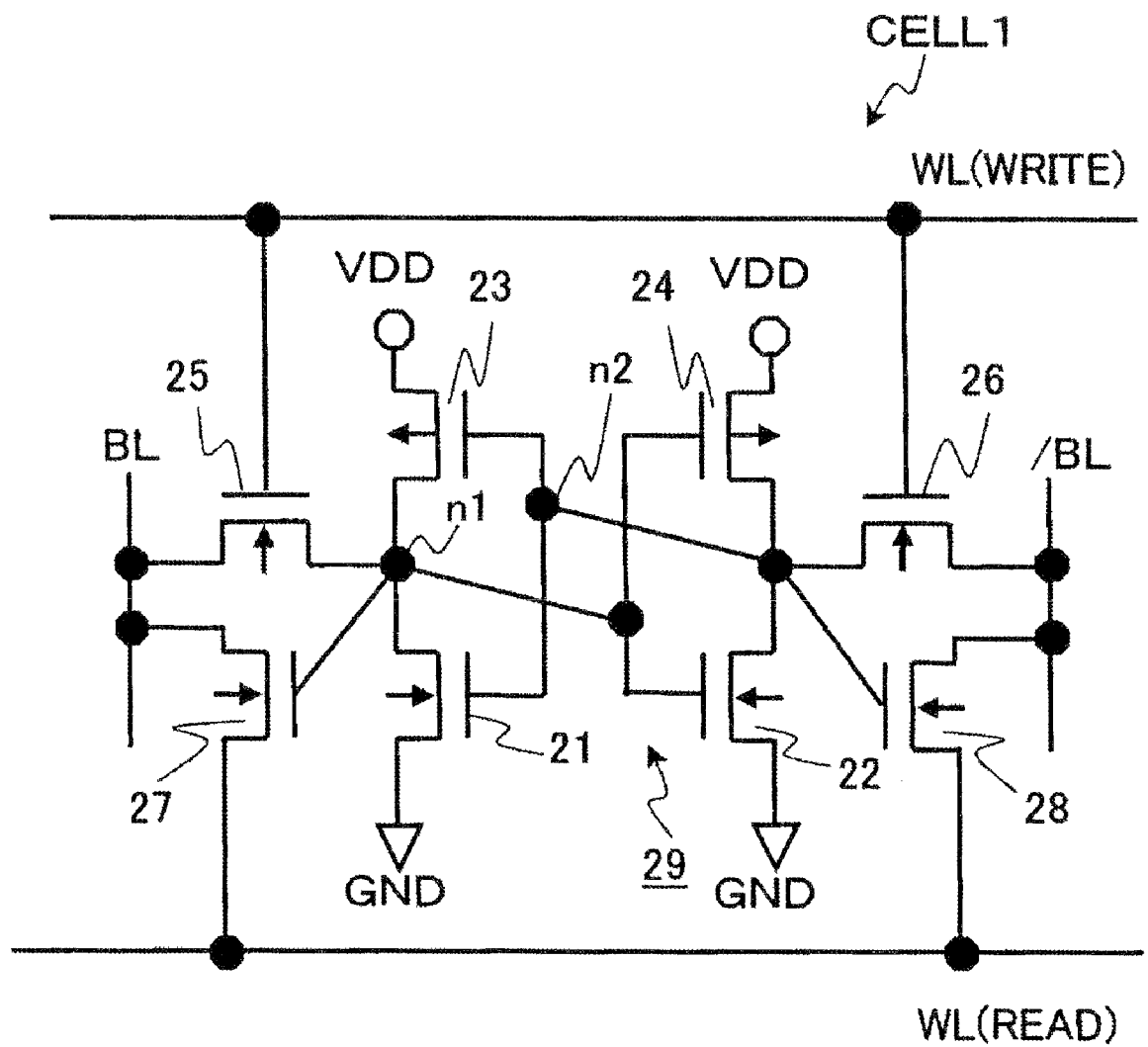
FIG. 2 shows an equivalent circuit of a SRAM cell CELL 1 of the semiconductor device 10 according to the first embodiment.

FIG. 2 shows a circuit configuration of the SRAM cell CELL 1. This SRAM cell includes NMOS transistors 21, 22, PMOS transistors 23, 24, transfer transistors 25, 26, and read transistors 27, 28.

In the NMOS transistor 21, a source is connected to a ground voltage supply GND, a drain is connected to a node n1, and a gate is connected to a node 2. In the NMOS transistor 22, a source is connected to the ground voltage supply GND, a drain is connected to the node n2, and a gate is connected to the node n1. In the PMOS transistor 23, a source is connected to an electric power supply VDD, a drain is connected to the node n1, and a gate is connected to the node n2. In the PMOS transistor 24, a source is connected to the electric power supply VDD, a drain is connected to the node n2, a gate is connected to the node n1. As described above, the latch circuit 29 is composed with NMOS transistors 21, 22 and PMOS transistors 23, 24.

In the transfer transistor 25, one terminal is connected to a bit line BL, the other terminal is connected to the node n1, and a gate is connected to a write word line WL (WRITE). In the transfer transistor 26, one terminal is connected to a complemental bit line /BL, the other terminal is connected to the node n2, and a gate is connected to the write word line WL (WRITE). The read transistor 27 is connected to the read word line WL (READ), a drain is connected to the bit line BL, a gate is connected to the node. In the read transistor 28, a source is connected to the read word line WL (READ), a drain is connected to the complemental bit line /BL, and a gate is connected to the node.

In the SRAM cell CELL 1 configured as described above, at writing data, high level is supplied to the write word line WL (WRITE) so that transfer transistors 25, 26 turn on. Hence, a pair of bit lines (BL and /BL) is connected to the latch circuit 29. The pair of bit lines is charged according to data for writing. Hence, the data is transferred to the latch circuit 29. At reading data, voltage is supplied to the read word line WL (READ). Here, the read transistors 27, 28 turn on/off according to the data stored in the latch circuit 29. According to switching condition on/off of the read transistors 27, 28, voltage level of the read word line WL (READ) is transferred to the bit line BL or the complemental bit line /BL. In this way, the data stored in the SRAM cell is read out. That is to say, the bit lines BL, /BL perform as output line of data in the SRAM cell.

Figure 3:
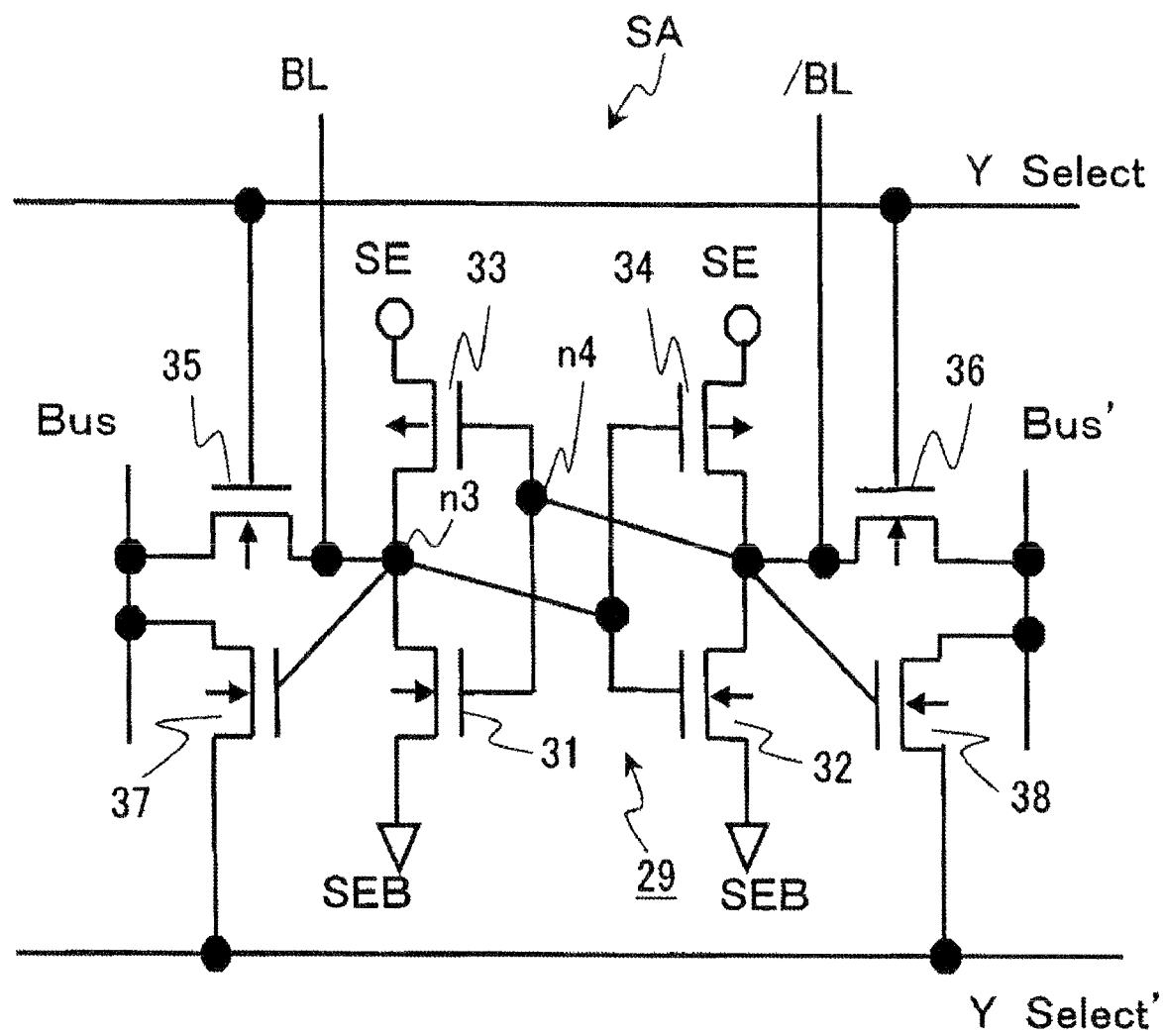
FIG. 3 shows an equivalent circuit of a sense amplifier SA of a DRAM of the semiconductor device 10 according to the first embodiment.

FIG. 3 shows a circuit configuration of sense amplifier of the DRAM according to the first embodiment. This circuit has NMOS transistors 31, 32, PMOS transistors 33, 34, transfer transistors 35, 36, and transistors 37, 38. The transistors 37, 38 correspond to the read transistors 27, 28 of FIG. 2. The transistors 37, 38 are called as read transistors 37, 38 hereinafter so that FIG. 3 corresponds to FIG. 2.

In the NMOS transistor 31, a source is connected to complemental sense enable SEB, which has an inverted voltage level of sense enable SE, a drain is connected to a node n3, and a gate is connected to a node n4. In the NMOS transistor 32, a source is connected to the complemental sense enable SEB, a drain is connected to the node n4, and the gate is connected to the node n3. In the PMOS transistor 33, a source is connected to sense enable SE, a drain is connected to the node n3, a gate is connected to the node n4. In the PMOS transistor 34, a source is connected to the sense enable SE, a drain is connected to the node n4, a gate is connected to the node n3. In the transfer transistor 35, one terminal is connected to a data bus BUS, the other terminal is connected to the node n3, a gate is connected a Y-select line Y-SELECT. In the transfer transistor 36, one terminal is connected to a data bus BUS', the other terminal is connected to the node n4, a gate is connected to the Y-select line Y-SELECT. The node n3 is connected to the bit line BL, and the node n4 is connected to the complemental bit line /BL.

This circuit of the sense amplifier SA of the DRAM has the same configuration as the circuit of the SRAM cell CELL 1 of the SRAM as described above. NMOS transistors 21, 22; PMOS transistors 23, 24, transfer transistors 25, 26 and read transistors 27, 28 of the SRAM cell correspond to NMOS transistors 31, 32, PMOS transistors 33, 34, transfer transistors 35, 36 and read transistors 37, 38 of the sense amplifier SA of the DRAM.

In the sense amplifier of the DRAM configured as described above, the circuit 39 (the latch circuit) amplifying potential difference between the bit lines (BL, /BL) amplifies the potential difference based on charge storage stored in a capacitor (not shown). The capacitor is connected to the pair of bit lines. When high level is supplied to the Y-select line Y-SELECT, the transfer transistors 35, 36 turn on. Hence, a voltage amplified by the latch circuit 39 is transferred to a data bus lines BUS, BUS'. The voltage transferred to the bus lines BUS, BUS' is judged so that the data stored in the capacitor corresponding to the DRAM cell is read out. That is to say, for the configuration of the sense amplifier of the DRAM, the bus lines BUS, BUS' correspond to a data output line.

Figure 8:
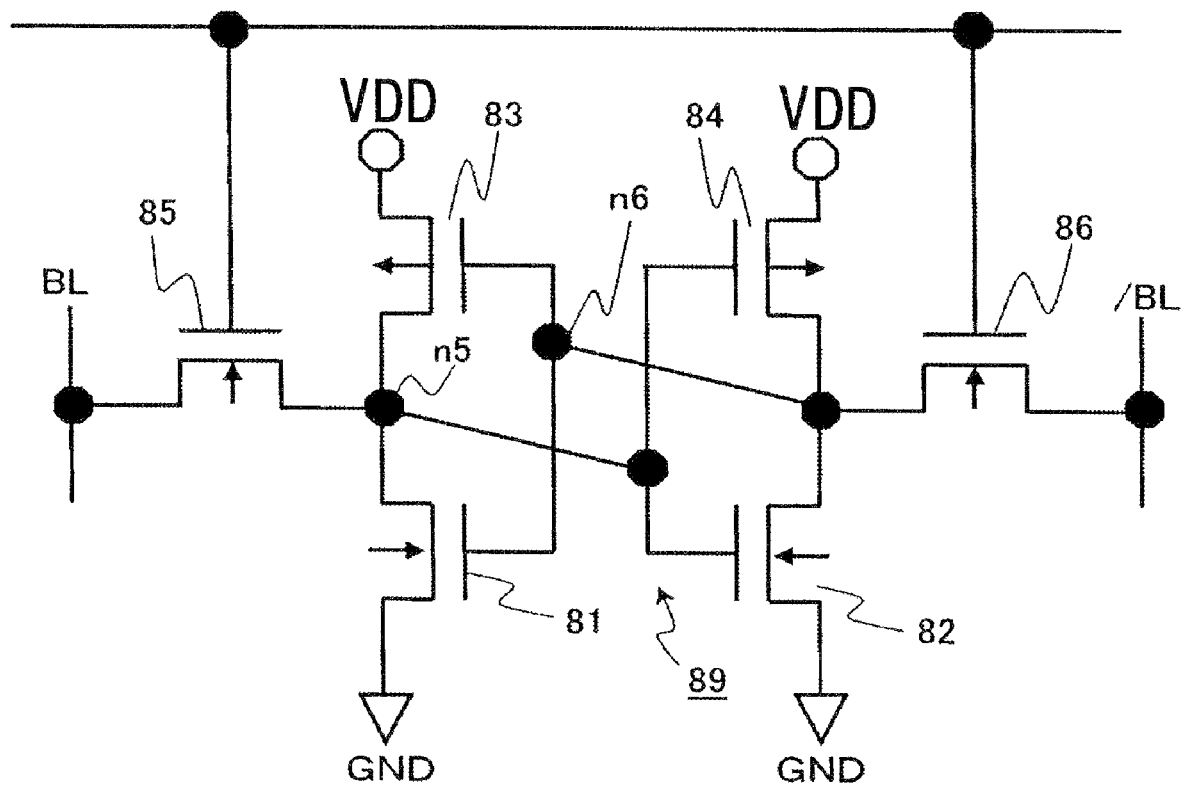
FIG. 8 shows an equivalent circuit of a SRAM cell of a conventional semiconductor device.

An advantage of the semiconductor device configured as explained above is described hereinafter. The conventional SRAM does not have the read transistors 27, 28. In the conventional SRAM, at reading data, data is read out based on a voltage level of the nodes n5, n6 in FIG. 8, when the transfer transistors 25, 26 turn on. For a circuit of the conventional SRAM at reading data, when the node n6 is high level, both transfer transistor 85 and an NMOS transistor 81 turn on. At this time, if a resistance of the transfer transistor 85 is larger than a resistance of the NMOS transistor 81 because of manufacturing variation, current does not flow through the transfer transistor 85 but flow through the NMOS transistor 81. As a result, data cannot be read out correctly in the conventional SRAM.

Figure 9:
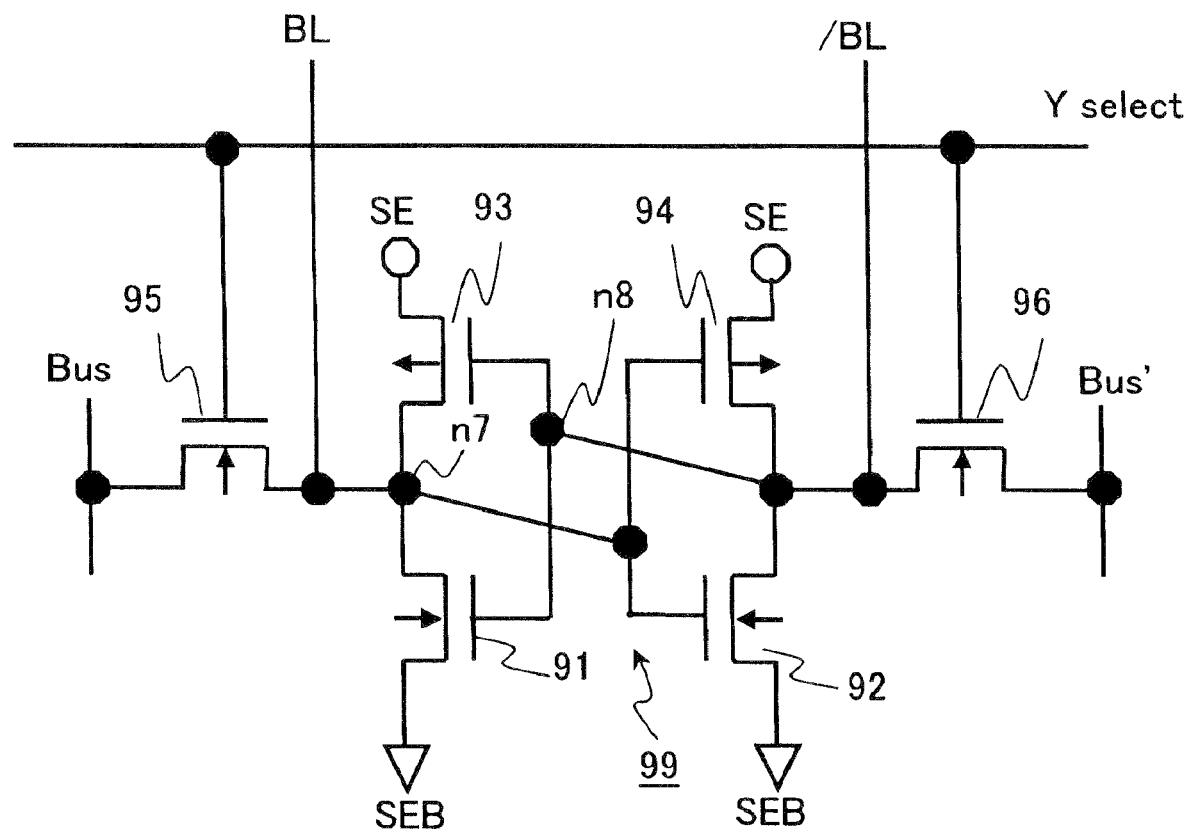
FIG. 9 shows an equivalent circuit of a sense amplifier of a DRAM of the conventional semiconductor device.

In the first embodiment, in consideration of the problem that there is reading error due to resistance ratio between the transfer transistor 85 and the NMOS transistor 81, a configuration is designed so that data does not been transferred to the bit lines BL, /BL through the transfer transistors 25, 26. That is to say, as shown in FIG. 2, the read transistors 27, 28 are formed in the SRAM. Hence, at reading data, data can be read out correctly through the transfer transistor 27, 28 without relation to a resistance difference between the transfer transistor 85 and the NMOS transistor 81. According to the design of the SRAM, the read transistors 37, 38 corresponding to the read transistors 27, 28, are formed in the sense amplifier of the conventional DRAM (see FIG. 9). As shown in FIG. 3, a tuning window of the SRAM can be matched to a tuning window of the DRAM, because the amplifier of the DRAM is formed as the same design as the SRAM cell CELL 1. Even if the control voltage is set to be low and operation environment becomes unstable, the control accuracy of the SRAM cell CELL 1 is ensured, because of the configuration of the SRAM cell CELL 1. Further, the sense amplifier of the DRAM has the same configuration as the SRAM cell CELL 1, both the electric power saving and higher productivity of the semiconductor device 10 can be obtained.

Second Embodiment

Figure 4:
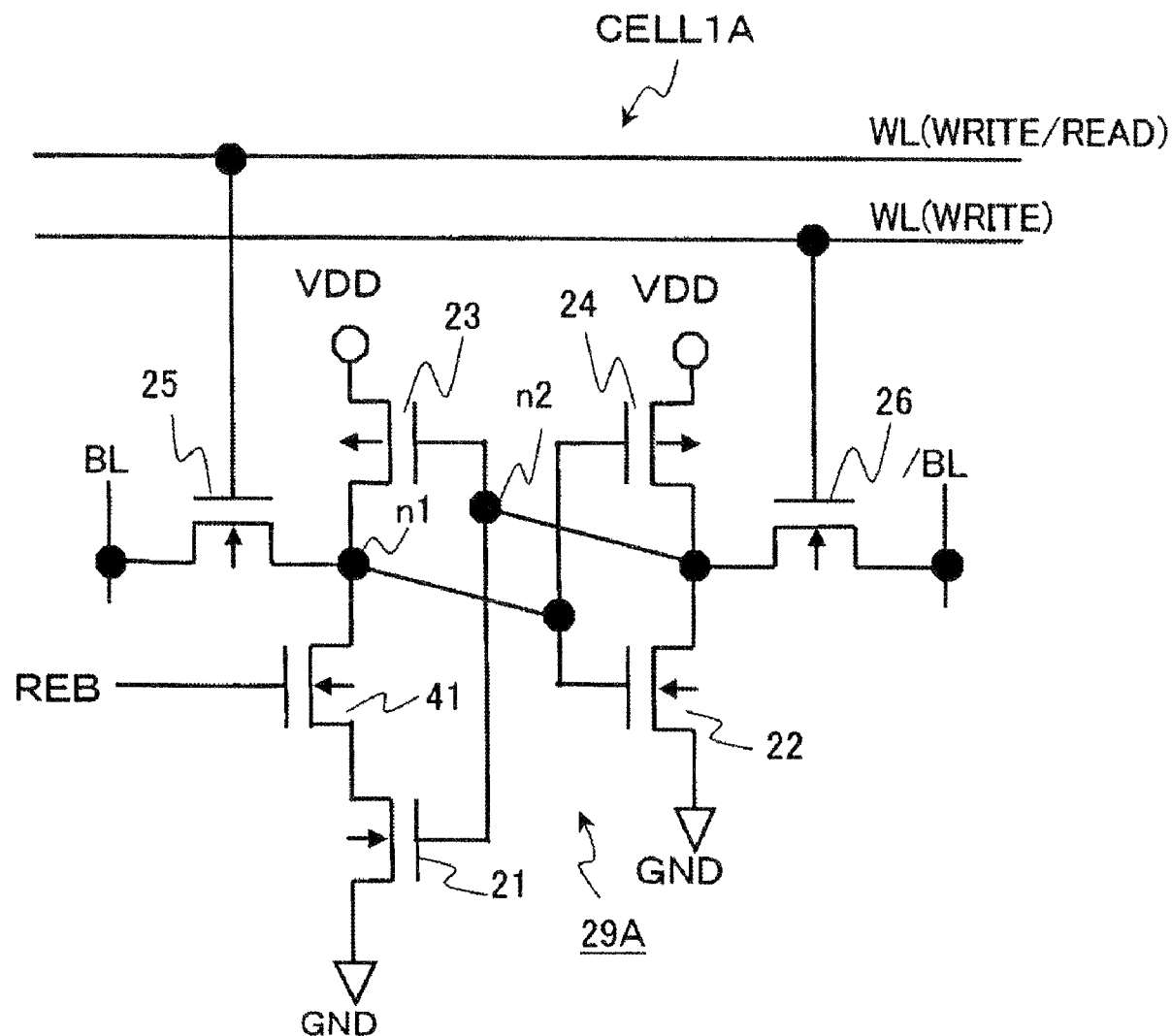
FIG. 4 shows an equivalent circuit of a SRAM cell CELL 1A of a semiconductor device according to a second embodiment.

FIG. 4 shows a circuit diagram of a SRAM cell CELL 1A of a semiconductor device according to a second embodiment. Whole configuration is the same as FIG. 1. The same number is numbered to a component having the same function to omit of explanation.

In the semiconductor device according to the second embodiment, a data protect transistor 41 is provided between the PMOS transistor 23 and the NMOS transistor 21 instead of the read transistor 27 of the first embodiment.

In the data protect transistor 41, a source is connected to the node n1, a drain is connected to the NMOS transistor 21, and a gate is connected to a gate control line REB as shown in FIG. 4.

For in the second embodiment, the gate of the transfer transistor 25 is connected to a write/read word line WL (WRITE/READ) and a gate of the transfer transistor 26 is connected to a write word line WL (WRITE).

In the SRAM cell CELL 1A of the semiconductor device according to the second embodiment, at writing data, high level is supplied to the write word line WL (WRITE) and the read/write word line WL (READ/WRITE). Hence, the transfer transistors 25, 26 turn on and data transferred from the bit lines BL, /BL is stored in the latch circuit 29A.

At reading data, high level is supplied to the write/read word line WL (WRITE/READ) so that the transfer transistor 25 turns on. Low level is supplied to the write word line WL (WRITE) so that the transfer transistor 26 turns off. Low level is supplied to the gate control line REB so that the data protect transistor 41 turns off. As a result, according to a voltage level H/L of the node n1, level of the bit line BL is determined.

As described above, in the second embodiment, the data protect transistor 41 is provided between the PMOS transistor 23 and the NMOS transistor 21. At reading data, when the data protect transistor turns off, a path between the NMOS transistor 21 and the transfer transistor 25 can be cut. As a result, a ratio-less can be obtained. The ratio-less means without relation to resistance ratio between the transfer transistor 25 and the NMOS transistor 21, data can be read out.

A sense amplifier SAA of the DRAM is the same circuit configuration as the circuit in FIG. 4. When the circuit configuration in FIG. 4 is applied as a sense amplifier of the DRAM, an electric power supply VDD in FIG. 4 is changed to sense enable SE. A ground voltage supply GND is changed to the complemental sense enable. The complemental sense amplifier enable has inverted level of voltage to the sense enable SE. The bit line BL is changed to a data bus BUS and the complemental bit line /BL to a complemental data bus BUS'. The bit lines BL, /BL from the DRAM cell are connected to the nodes n1, n2 in FIG. 4. The write/read word line WL (WRITE/READ) in FIG. 4 is changed to a Y-select line Y-SELECT.

As described above, because of the data transistor 41, incidence of the error due to the resistance ratio between the NMOS transistor 21 and the transfer transistor 25 can be prevented. It makes that a fine operation can be obtain even in low-voltage condition. Further, it makes yield ratio improved and high productivity can be obtained in the semiconductor device providing both SRAM and DRAM. When the configuration of the SRAM cell CELL 1A is formed in much the same way as the sense amplifier of the DRAM like the first embodiment, a manufacturing optimum condition of the SRAM cell can be conformed to that of the sense amplifier. Hence, an effect of the manufacturing variation can be reduced.

Third Embodiment

Figure 5:
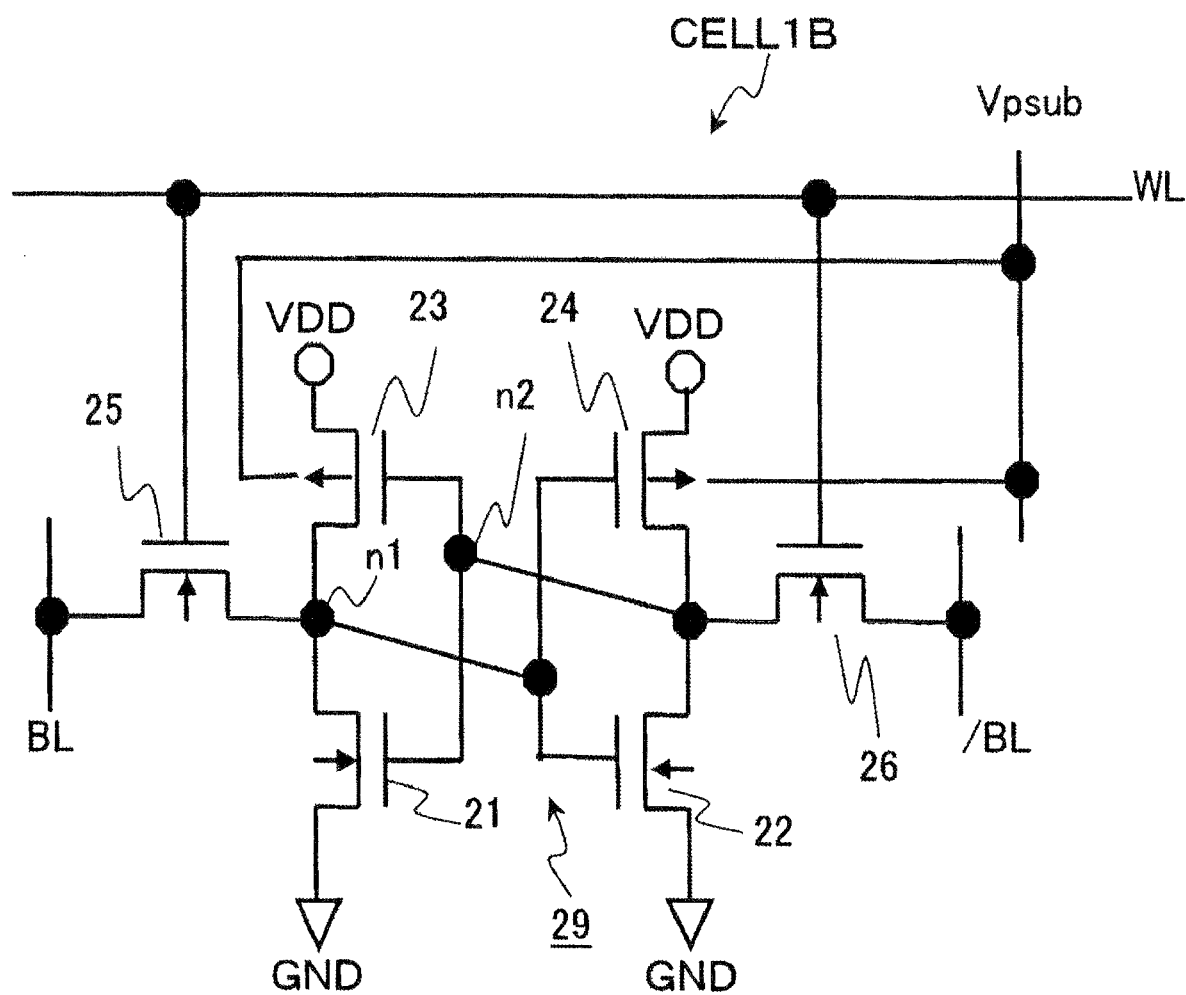
FIG. 5 shows an equivalent circuit of a SRAM cell CELL 1B of a semiconductor device according to a third embodiment.

FIG. 5 shows a circuit diagram of SRAM cell CELL 1B of a semiconductor device according to a third embodiment. Whole configuration is the same as the configuration in FIG. 1. In the SRAM cell CELL 1B of the third embodiment, a back gate control line VPSUB is provided instead of the read transistor 27 of the first embodiment. The back gate control line VPSUB controls back gate voltage of the PMOS transistors 23, 24. The other configuration is the same as the first embodiment.

As shown in FIG. 5, the back gate control line VPSUB is connected to a back gate of the PMOS transistors 23, 24 of SRAM cell CELL 1B. In the SRAM cell configured as described above, at writing data, the back gate control line VPSUB is set to be high voltage. As a result, the PMOS transistors 23, 24 are set to be difficult to turn on at writing data. At writing data, resistance of the PMOS transistors 23, 24 is set to be high. Hence, a margin for writing can be maintained even at low voltage.

A sense amplifier SAB of the DRAM of the semiconductor device according to the third embodiment is formed as the same configuration as an equivalent circuit in FIG. 5. When the configuration in FIG. 5 is applied to the sense amplifier of the DRAM, the electric power supply VDD in FIG. 5 is changed to sense enable SE, and the ground voltage supply GND is set to be complemental sense amplifier enable. The complemental sense amplifier enable has inverted level of voltage to the sense enable SE. The bit line in FIG. 5 is set to be a data bus BUS, and the complemental bit line /BL is to be a complemental data bus BUS'. The bit lines BL, /BL from the DRAM cell are connected to the nodes n1, n2 in FIG. 5. The word line in FIG. 5 is changed to the Y-select line Y-SELECT.

Herewith, it makes the margin for writing expanded and productivity improved in the semiconductor device.

Fourth Embodiment

Figure 6:
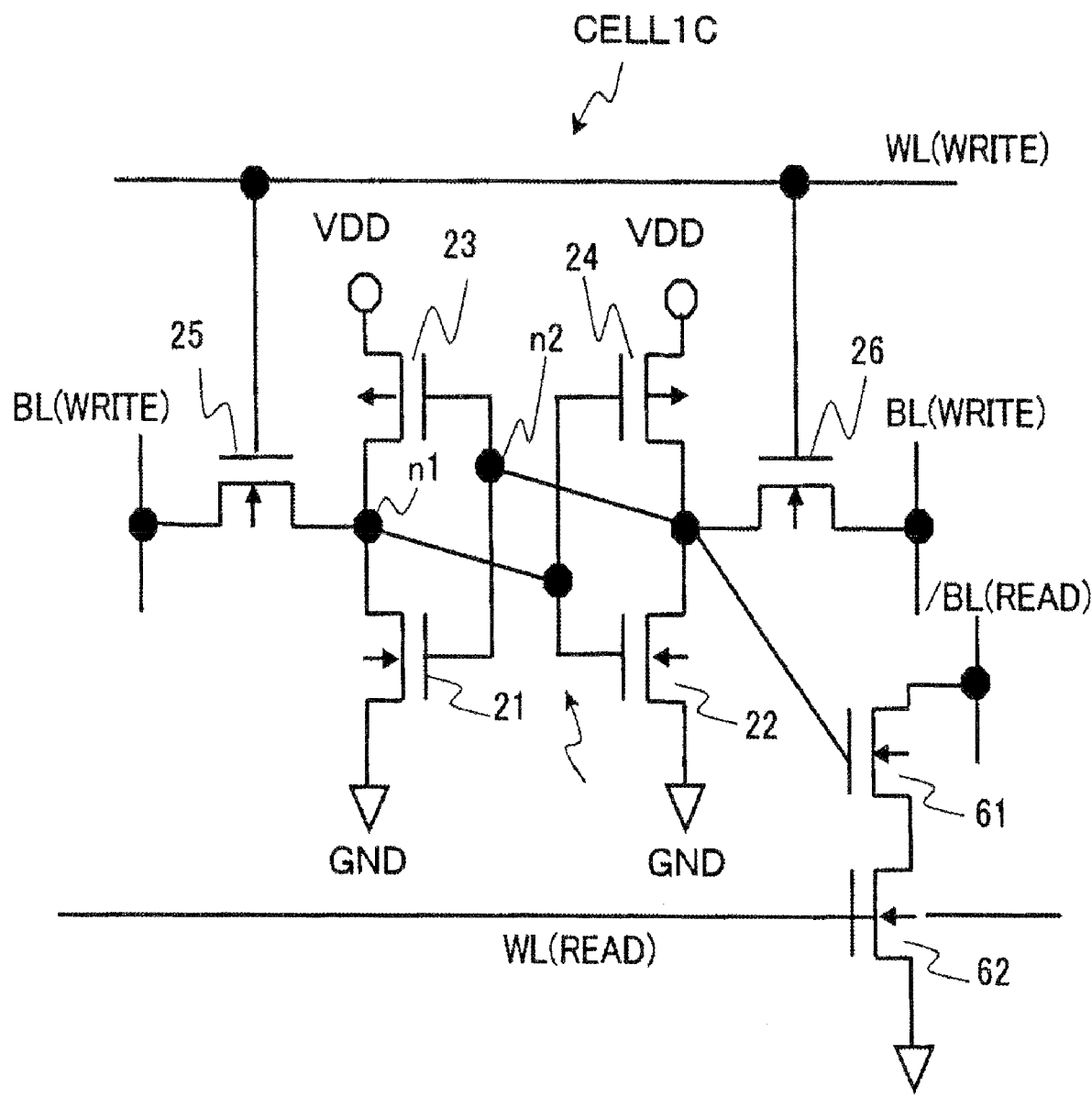
FIG. 6 shows an equivalent circuit of a SRAM cell CELL 1C according to a fourth embodiment.

FIG. 6 shows an equivalent diagram of a SRAM cell CELL 1C of the semiconductor device according to a fourth embodiment. Whole configuration is about the same as configuration in FIG. 1. In the SRAM cell CELL 1C of the fourth embodiment, the bit line BL and the word line WL are provided for writing and reading individually.

The SRAM cell CELL 1C provides NMOS transistors 21, 22, the PMOS transistors 23, 24, and the transfer transistors 25, 26 in the first embodiment. The SRAM cell CELL 1C further comprises read NMOS transistor 61, 62.

As shown in FIG. 6, in the read NMOS transistor 61, a source is connected to a drain of the read NMOS transistor 62, a gate is connected to the node n2, and a drain is connected to a read bit line BL (READ). In the read NMOS transistor 62, a source is connected to the ground voltage supply GND, a drain is connected to the source of the read NMOS transistor 61, a gate is connected to the read word line WL (READ). In the transfer transistor 25, one terminal is connected to the write bit line BL (WRITE), the other terminal is connected to the node n1, and the gate is connected to the write word line WL (WRITE). In the transfer transistor 26, one terminal is connected to the write bit line BL (WRITE), the other terminal is connected to the node n2, a gate is connected to the write word line WL (WRITE).

In the SRAM cell CELL 1C configured as described above, at writing data, high level is supplied to the write word line WL (WRITE) so that the transfer transistors 25, 26 turn on. Hence data for writing is transferred from the write bit line BL (WRITE) to the latch circuit 29. On the other hand, at reading data, high level is supplied to the read word line WL (READ) so that the read transistor 62 turn on. Hence, the read transistor 61 turns on/off based on a voltage level of the node n2. A voltage level of the read bit line /BL (READ) is determined.

As described above, with providing the word line WL and the bit line BL for writing and reading individually, different transistor operates at reading and at writing. Hence, the ratio limit for reading is improved like the first and the second embodiment. Further, with providing the word line WL and the bit line BL for writing and reading individually, a change operation between reading and writing can be operated quickly.

The sense amplifier SAC of the DRAM of the semiconductor device according to the fourth embodiment is formed as the same configuration as the equivalent circuit in FIG. 6. When the configuration in FIG. 6 is applied to the sense amplifier, the electric voltage supply VDD in FIG. 6 is set to be sense enable SE, and the ground voltage supply GND is set to be complemental sense enable SEB. The complemental sense enable has the inverted voltage level to the sense enable SE. The bit line in FIG. 6 is set to be a data bus BUS, and the complemental bit line /BL is set to be a complemental data bus BUS'. The bit lines BL, /BL from the DRAM cell are connected to the node n1, n2 in FIG. 5. The write word line WL (WRITE) is changed to a Y-select line Y-SELECT.

Herewith, operation control and the ratio limit can be improved. Hence, productivity is improved in the semiconductor device including both SRAM and DRAM.

Fifth Embodiment

Figure 7:
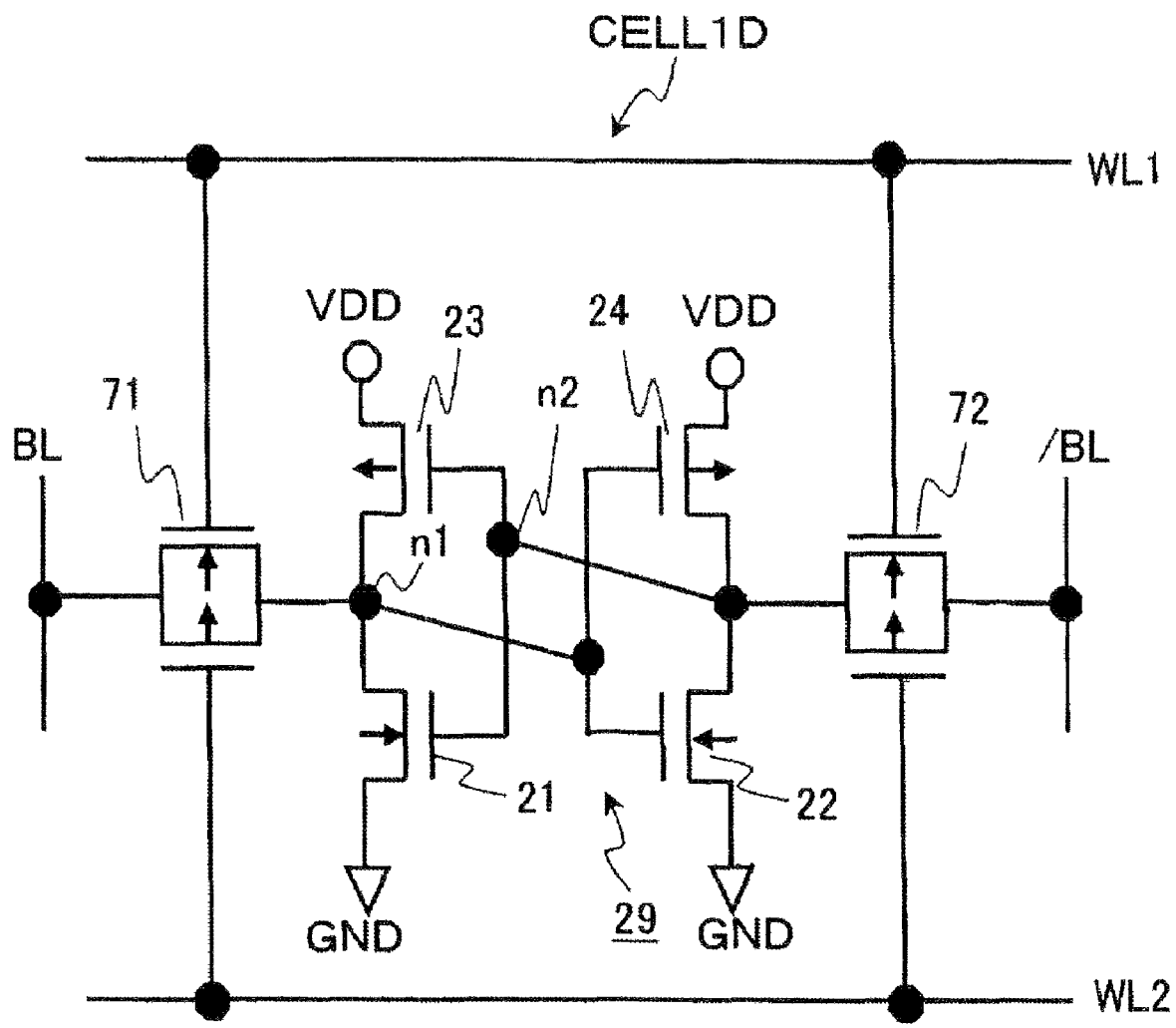
FIG. 7 shows an equivalent circuit of a SRAM cell CELL 1D according to a fifth embodiment.

FIG. 7 shows a circuit diagram of a SRAM cell CELL 1D of the semiconductor device according to a fifth embodiment. Whole configuration is the same as the configuration in FIG. 1. For an aspect of the fifth embodiment, transfer gates 71, 72 are provided instead of the transfer transistors 25, 26 in the first embodiment. The transfer gate 71 is a NMOS transistor which gate is connected to a first word line WL1, and the transfer gate 72 is a PMOS transistor which gate is connected to a second word line WL2.

As described above, with providing the transfer gates 71, 72, a resistance value of the transfer gates 71, 72 can be lower than the transfer transistors 21, 22 which consist of one transistor. Hence, at writing data, a resistance value of the PMOS transistors 23, 24 is higher than the transfer gates 71, 72. Current flows from the node n1 through the NMOS transistor 21. Hence, it makes an operation error lessen.

Here, the sense amplifier SAD of the DRAM of the semiconductor device according to the fifth embodiment is formed in much the same way as the equivalent circuit in FIG. 7. When the configuration in FIG. 7 is applied to the DRAM, the electric power supply VDD is set to be sense enable SE and the ground voltage supply GND is set to be complemental sense enable SEB. The complemental sense enable SEB is inverted voltage level to the sense enable SE. The bit line BL in FIG. 7 is changed to the data bus BUS and the complemental bit line /BL to complemental data bus BUS'. The bit lines BL, /BL from the DRAM cell are connected to the node n1, n2 in FIG. 7. The write word line WL (WL1, WL2) in FIG. 7 is changed to the Y-select line Y-SELECT.

As described above, a tolerance for variation of P/N ratio can be improved at reading and writing, because the resistance value of the transfer gate 71, 72 is designed to be lower than the transistors 21-24. The transistors 21-24 constitute the latch circuit. Hence, the productivity is improved in the semiconductor device providing both DRAM and SRAM.

As described above, in the embodiments from the first embodiment to the fifth embodiment, the SRAM cell is designed so that the margin for writing and reading of the SRAM is larger. The sense amplifier of DRAM is formed as to conform to the SRAM. However, only if the SRAM designed to improve the margin for writing and reading and the sense amplifier of the DRAM is formed according the design of the SRAM, the circuit configuration described in the first to the fifth embodiments is not limited. For a variety of the circuit configurations, the aspect of this invention can be obtained. As described above, in the embodiments from the first embodiment to the fifth embodiment, firstly the circuit is designed so that the margin for operation is larger and secondly the circuit configuration is applied to the sense amplifier of the DRAM. But, it may be the reverse method. That is to say, a circuit configuration designed for the sense amplifier of the DRAM may be applied to the SRAM cell. Even in this method, the aspect can be obtained that the tuning window of the SRAM is conformed to the tuning window of the DRAM.

It is apparent that the present invention is not limited to the above embodiment but may be modified and changed without departing from the scope and spirit of the invention.

What is claimed is:

1. A semiconductor device comprising:
   a first memory cell that stores data using a latch circuit, wherein the first memory cell includes a circuit configuration having more than seven transistors;
   a second memory cell storing data using a capacitor; and
   a sense amplifier that detects data stored in the second memory cell, wherein the sense amplifier includes a circuit configuration having more than seven transistors, and wherein said sense amplifier leads out only said second memory cell.

2. The semiconductor device according to claim 1, wherein the first memory cell and the sense amplifier further comprise:
   a latch circuit comprising a first inverter and a second inverter, the first inverter including an input terminal connected to an output terminal of the second inverter and an output terminal connected to an input terminal of the second inverter, and
   wherein at least one of output of the first and the second inverters is output to the same or differing output lines through a differing transistor.

3. The semiconductor device according to claim 1, wherein the first memory cell and the sense amplifier further comprise:
   a latch circuit comprising a first inverter and a second inverter, the first inverter including an input terminal connected to an output terminal of the second inverter and an output terminal connected to an input terminal of the second inverter, and wherein at least one of the first and the second inverters comprises a switching transistor between a load transistor and a drive transistor, the switching transistor switching a connection between the load transistor and the drive transistor.

4. The semiconductor device according to claim 1, wherein the first memory cell and the sense amplifier further comprises:
a latch circuit including a first inverter and a second inverter, the first inverter including an input terminal connected to an output terminal of the second inverter and an output terminal connected to an input terminal of the second inverter; and
a transfer transistor transferring data stored in the latch circuit, and
wherein a resistance value of the transfer transistor is lower than a resistance value of the load transistor of the latch circuit.

5. The semiconductor device according to claim 1, wherein the first memory cell and the sense amplifier further comprise:
a latch circuit comprising a first inverter and a second inverter, the first inverter including an input terminal connected to an output terminal of the second inverter and an output terminal connected to an input terminal of the second inverter, and
a transfer transistor transferring data stored in the latch circuit, and
wherein a resistance value of the transfer transistor is lower than a resistance value of a drive transistor of the latch circuit.

6. The semiconductor device according to claim 1, wherein the first memory cell and the sense amplifier further comprise:
a latch circuit comprising a first inverter and a second inverter, the first inverter including an input terminal connected to an output terminal of the second inverter and an output terminal connected to an input terminal of the second inverter; and
a control line controlling a substrate voltage of a load transistor of the latch circuit.

7. The semiconductor device according to claim 1, wherein the latch circuit comprises:
a first memory cell inverter and a second memory cell inverter, the first memory cell inverter including an input terminal connected to an output terminal of the second memory cell inverter and an output terminal connected to an input terminal of the second memory cell inverter; and
wherein the first memory cell comprises
a transistor switching connection between a word line corresponding to the first memory cell and a bit line, based on output of the first memory cell inverter and the second memory cell inverter at reading data, and
wherein the sense amplifier comprises
a first amplifier inverter and a second sense amplifier inverter, the first sense amplifier inverter including an input terminal connected to an output terminal of the second sense amplifier inverter and an output terminal connected to an input terminal of the second sense amplifier inverter; and
a transistor switching connection between a select line corresponding to the second memory cell and a data bus line, based on an output of the first sense amplifier inverter and the second sense amplifier inverter at detecting data.

8. The semiconductor device according to claim 1, wherein the first memory cell and the sense amplifier comprise:
two inverters connecting a first conductivity type transistor and a second conductivity type transistor,
a switching device cutting an electrical connection between the second conductivity type transistor constituting the inverter and at least one of an output terminal of the two inverters.

9. The semiconductor device according to claim 1, wherein the first memory cell and the sense amplifier comprise:
two inverters connecting a first conductivity type transistor and a second conductivity type transistor; and
a control line controlling a substrate voltage of the first memory cell or the first conductivity type transistor of the sense amplifier.

10. The semiconductor device according to claim 1, wherein,
the first memory cell comprises a plurality of first conductivity type transistors and a plurality of second conductivity type transistors, and
the sense amplifier comprises the same number of first conductivity type transistors and second conductivity type transistors as the first memory cell.

11. The semiconductor device according to claim 1, wherein the sense amplifier has the same circuit configuration as the first memory cell.

12. A semiconductor device comprising:
a first memory cell that stores first data in a latch circuit, wherein the first memory cell includes a circuit configuration having more than seven transistors; and
a second memory cell storing second data stored independent of said first data, said second data being stored in a capacitor;
a sense amplifier that detects said second data stored in the second memory cell, wherein the sense amplifier has about the same circuit configuration as the first memory cell and detecting data stored in the second memory cell,
wherein the first memory cell comprises a plurality of first conductivity type transistors and a plurality of second conductivity type transistors, and
wherein the sense amplifier comprises the same number of first conductivity type transistors and second conductivity type transistors as the first memory cell.

13. The semiconductor device according to claim 12, wherein the first memory cell and the sense amplifier comprise:
a latch circuit comprising a first inverter and a second inverter, the first inverter including an input terminal connected to an output terminal of the second inverter and an output terminal connected to an input terminal of the second inverter, and
wherein at least one of an output of the first inverter and the second inverter is output to the same or differing output lines through a differing transistor.

14. The semiconductor device according to claim 12, wherein the first memory cell and the sense amplifier comprise:
a latch circuit comprising a first inverter and a second inverter, the first inverter including an input terminal connected to an output terminal of the second inverter and an output terminal connected to an input terminal of the second inverter, and
wherein at least one of the first inverter and the second inverter comprises a switching transistor between a load transistor and a drive transistor, the switching transistor switching a connection between the load transistor and the drive transistor.

15. The semiconductor device according to claim 12, wherein the first memory cell and the sense amplifier comprise:
- a latch circuit including a first inverter and a second inverter, the first inverter including an input terminal connected to an output terminal of the second inverter and an output terminal connected to an input terminal of the second inverter; and
- a transfer transistor transferring data stored in the latch circuit, and
- wherein a resistance value of the transfer transistor is lower than a resistance value of the load transistor of the latch circuit.

16. The semiconductor device according to claim 12, wherein the first memory cell and the sense amplifier comprise:
- a latch circuit comprising a first inverter and a second inverter, the first inverter including an input terminal connected to an output terminal of the second inverter and an output terminal connected to an input terminal of the second inverter, and
- a transfer transistor transferring data stored in the latch circuit, and
- wherein a resistance value of the transfer transistor is lower than a resistance value of a drive transistor of the latch circuit.

17. The semiconductor device according to claim 12, wherein the first memory cell and the sense amplifier comprise:
- a latch circuit comprising a first inverter and a second inverter, the first inverter including an input terminal connected to an output terminal of the second inverter and an output terminal connected to an input terminal of the second inverter; and
- a control line controlling substrate voltage of a load transistor of the latch circuit.

18. The semiconductor device according to claim 12, wherein the latch circuit comprises:
- a first memory cell inverter and a second memory cell inverter, the first memory cell inverter including an input terminal connected to an output terminal of the second memory cell inverter and an output terminal connected to an input terminal of the second memory cell inverter; and
- wherein the first memory cell comprises a transistor switching connection between a word line corresponding to the first memory cell and a bit line, based on an output of the first memory cell inverter and the second memory cell inverter at reading data, and
- wherein the sense amplifier comprises a first sense amplifier inverter and a second sense amplifier inverter, the first sense amplifier inverter including an input terminal connected to an output terminal of the second sense amplifier inverter and an output terminal connected to an input terminal of the second sense amplifier inverter; and
- a transistor switching connection between a select line corresponding to the second memory cell and a data bus line, based on an output of the first sense amplifier inverter and the second sense amplifier inverter at detecting data.

19. The semiconductor device according to claim 12, wherein the first memory cell and the sense amplifier comprise:
- two inverters connecting a first conductivity type transistor and a second conductivity type transistor,
- a switching device cutting an electrical connection between the second conductivity type transistor constituting the inverter and at least one of an output terminal of the two inverters.

20. The semiconductor device according to claim 12, wherein said first memory cell and said second memory cell comprise a SRAM cell and a DRAM cell, respectively.

21. A semiconductor device comprising:
- a SRAM cell that stores first data, said the SRAM cell including a circuit configuration having more than seven transistors;
- a DRAM cell storing second data stored independent of said first data; and
- a sense amplifier that detects the second data stored in the DRAM cell,
- wherein the sense amplifier includes a circuit configuration having more than seven transistors and wherein said sense amplifier has the same circuit configuration as the first memory cell.

22. The semiconductor device according to claim 21, wherein said sense amplifier leads out only said second memory cell.

* * * * *